United States Patent [19]

Fukuyama

[11] Patent Number: 4,748,539

[45] Date of Patent: May 31, 1988

[54] CIRCUIT BOARD SUPPORTING ARRANGEMENT FOR ELECTRONIC EQUIPMENT

[75] Inventor: Katsuo Fukuyama, Kamakura, Japan

[73] Assignee: Mitsubishi Denki Kabushiki Kaisha, Japan

[21] Appl. No.: 5,610

[22] Filed: Jan. 21, 1987

[30] Foreign Application Priority Data

Jan. 22, 1986 [JP] Japan .................................. 61-11364
Apr. 9, 1986 [JP] Japan .................................. 61-81418

[51] Int. Cl.⁴ ............................................. H05K 5/04
[52] U.S. Cl. ...................... 361/399; 206/334; 206/592; 361/415; 361/417; 361/419
[58] Field of Search ............... 206/328, 334, 560–561, 206/591–592; 211/41; 361/395, 399, 417–420, 415

[56] References Cited

U.S. PATENT DOCUMENTS 4,093,068 6/1978 Smrt ..................................... 206/592
4,418,820 12/1983 Nagle et al. ......................... 206/334
4,426,675 1/1984 Robinson et al. .................. 206/328

Primary Examiner—A. D. Pellinen
Assistant Examiner—Gregory D. Thompson
Attorney, Agent, or Firm—Leydig, Voit & Mayer

[57] ABSTRACT

An arrangement for supporting one or more circuit boards within an electronic equipment housing including a first rigidly supporting member and a second loosely supporting member. The second loosely supporting member includes a base plate and a biasing member. The biasing member is disposed between the housing and the base plate or between the base plate and slot members, or both, in such a manner that it biases the slot members towards the first rigidly supporting member. The slot members are thereby biased to loosely hold the loose ends of the circuit boards, and thus, the circuit boards, which are disposed between the first rigidly supporting member and the second loosely supporting member, are prevented from sliding out of the slot members, even when the loose ends of the circuit boards move relative to the housing due to shocks and vibration during transportation or handling.

9 Claims, 3 Drawing Sheets

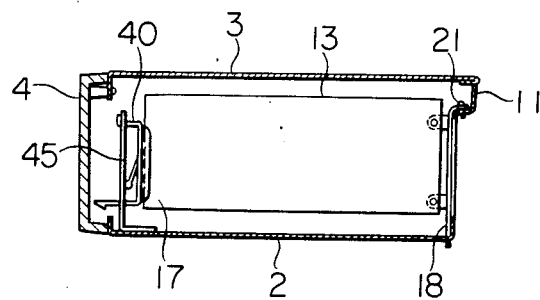
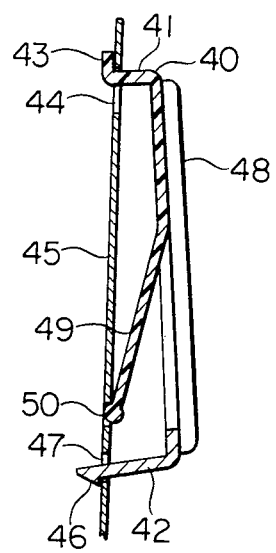
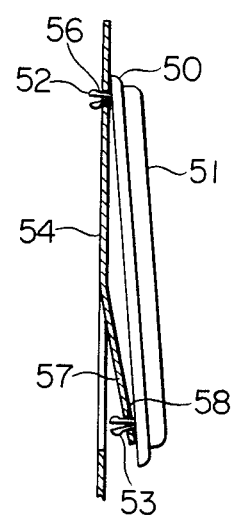
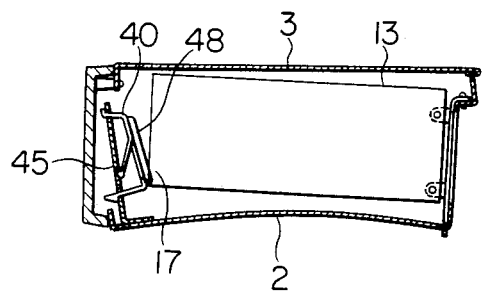

CIRCUIT BOARD SUPPORTING ARRANGEMENT FOR ELECTRONIC EQUIPMENT

BACKGROUND OF THE INVENTION

This invention relates to a circuit board support arrangement for electronic equipment.

FIGS. 1, 2 and 3 illustrate one example of the conventional circuit board support arrangements for supporting circuit boards within an electronic equipment housing.

In the figures, the electronic equipment housing 1 comprises a chassis 2, a cover plate 3, a front panel 4 and a bracket 5. The chassis 2 is composed of a bottom plate 10, a rear plate 11 vertically extending from one end of the bottom plate 10, and a front plate 12 vertically extending from the other end of the bottom plate 10, so that these three plates 10, 11 and 12 together constitute a substantially U-shaped frame. The cover plate 3 is fixed at one end thereof to the rear plate 11 and at the other end thereof to the front panel 4 in a conventional manner. The electronic equipment housing 1 is provided with an arrangement for supporting one or more circuit boards 13.

The conventional support arrangement comprises a first support 14 and a second support 15 for supporting a plurality of circuit boards 13 therebetween. Each circuit board 13 has a first end 16 (the righthand end in FIG. 1) and a second end 17 (the lefthand end in FIG. 1). The first support 14 comprises a fixing member 18 for rigidly supporting the first end 16 of a circuit board 13 on the rear plate 11 of the housing 1. The fixing member 18 is substantially an elongated member extending along the first end 16 of a circuit board 13 and firmly secured to the first end 16 by means of screws 19 and tabs 20. The lower end of the fixing member 18 is inserted into a slit formed in the bottom plate 10 of the housing 1 and the upper end of the fixing member 18 is secured to the rear plate 11 by a screw 21. The second support 15 comprises a base plate 22 which is provided with a plurality of fitting projections 23. The bracket 5 is provided with a plurality of fitting holes 24 which are located in a corresponding relationship with respect to the fitting projections 23. The base plate 22 is attached to the bracket 5 through the fitting projections 23 and fitting holes 24. The base plate 22 is further provided with a plurality of elongated slot members 25 for slidably receiving therein the second ends 17 of the circuit boards 13, each slot member 25 being integrally moulded with the base plate 22.

The reason why the circuit boards 13 are removably supported by the second support 15 is that the circuit boards are often required to be easily replaced by other circuit boards having different functions in accordance with the need of end users.

Referring now to FIG. 3, in the conventional circuit board support arrangement for electronic equipment, the chassis 2 may be temporarily deformed or twisted due to shocks such as vibration or falls during transportation in such a manner that the first support 14 and the second support 15 are moved away from each other as shown in FIG. 3. During this time, the second ends 17 of the circuit boards 13 tend to slide out from the slot members 25 of the second support 15.

When the above stated shocks cease, the chassis 2 restores its original shape, whereby the first and second supports 14 and 15 return to their respective original relative positions. However, the second ends 17 of the circuit boards 13 do not always slip back into their respective slots in the slot member 25. In the case where a circuit board 13 slips out of the slot of the slot member 25 completely and fails to slip back into its respective slot, it is no longer supported by the second support 15, but rather is only supported by the first support 14. Due to such shocks as vibration and falls, as above described, which may subsequently occur, the partially supported circuit board 13 may come into contact with the side plates of the housing or other circuit boards in its vicinity, thereby causing it to be damaged.

SUMMARY OF THE INVENTION

Accordingly, an object of the present invention is to provide an arrangement for supporting one or more circuit boards in an electronic equipment housing free from the above described problems.

The circuit board support arrangement for electronic equipment according to the present invention comprises first support means disposed in the housing for rigidly supporting first ends of the circuit boards on the housing and second support means disposed in the housing for slidably receiving therein and loosely supporting second free ends of the circuit boards. The second support means is sufficiently elastic to allow the second support means to follow the second free ends of the circuit boards, even when the loosely supported second ends of the circuit boards move relative to the housing due to shocks (such as vibration and falls) during transportation or handling.

BRIEF DESCRIPTION OF THE DRAWINGS

The present invention will become more readily apparent from the following detailed description of the preferred embodiment of the invention taken in conjunction with the accompanying drawings, in which:

FIG. 7 is a cross sectional view of an arrangement for supporting circuit boards in a housing according to another embodiment of the present invention;

FIG. 8 is a side view of a second support according to the embodiment of the present invention shown in FIG. 7;

FIG. 9 is a cross-sectional view of the housing shown in FIG. 7 when it is deformed; and FIG. 10 is a side view of a second support according to still another embodiment of the present invention.

DETAILED DESCRIPTION OF THE PREFERRED EMBODIMENTS

Figure 1:
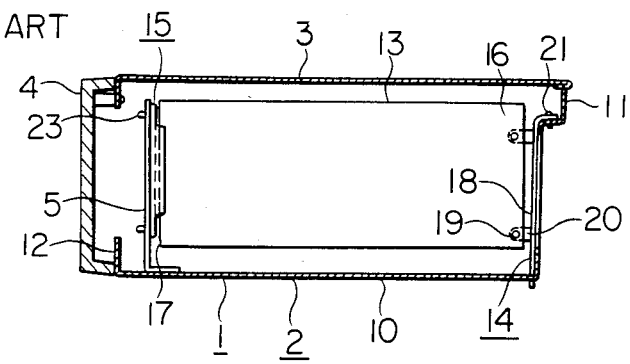
FIG. 1 is a cross sectional view of a conventional arrangement for supporting circuit boards within an electronic equipment housing.
Figure 4:
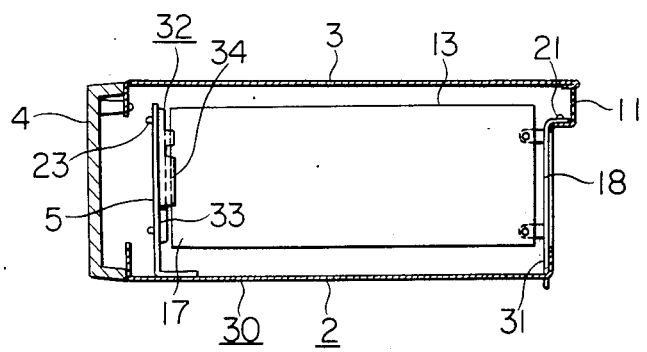
FIG. 4 is a cross sectional view of an arrangement for supporting circuit boards in a housing according to the present invention.
Figure 5:
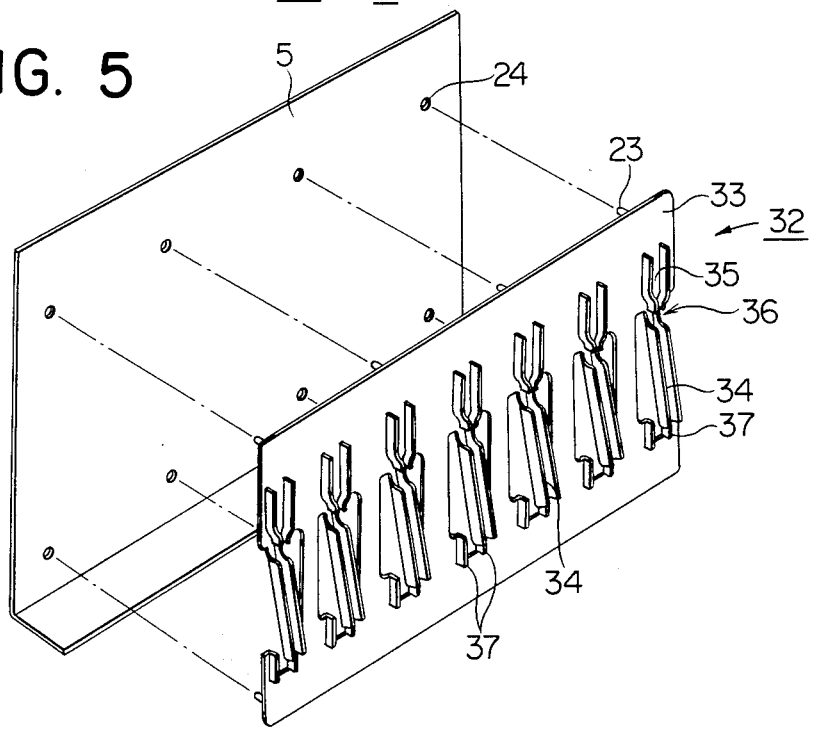
FIG. 5 is a perspective view of a second support having a plurality of slot members of the arrangement according to the present invention.
Figure 6:
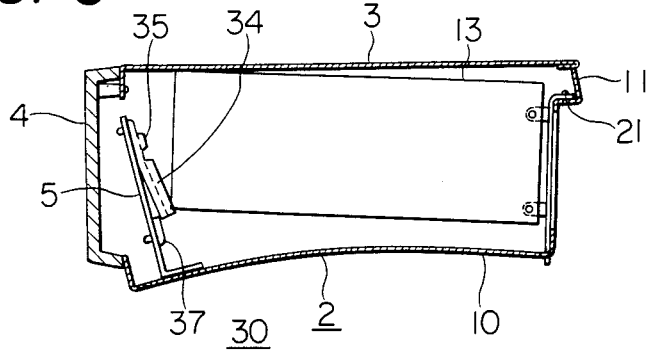
FIG. 6 is a cross sectional view of the housing shown in FIG. 4 when it is deformed.

FIGS. 4 to 6 illustrate a circuit board support arrangement of the present invention for use in an electronic equipment housing 30. The arrangement for supporting the circuit boards comprises a first support 31 which is the same as the conventional first support 14 shown in FIG. 1 and a second support 32 mounted to the bracket 5 as best seen in FIG. 5. The second support 32 comprises a base plate 33 having thereon a plurality of elongated slot members 34, a plurality of card guiding members 35, a plurality of biasing members 36 and a plurality of slot member guides 37, which are integrally made of an elastic plastic material such as polystyrene and polypropylene with the base plate 33.

Each slot member 34 has a U-shaped cross section and supports a circuit board 13. The biasing member 36 is disposed between the base plate 33 and one end of the slot member 34 and connects them so that the free end of the slot member 34 is biased toward or against the second end 17 of the circuit board 13 due to the elasticity of the material of the biasing member 36, thereby allowing the slot member 34 to follow the second end 17 of the circuit board 13. Each card guiding member 35 comprises two walls arranged in a substantially a U-shape, the bottom of which is open, such that the second end 17 of a circuit board 13 is easily guided thereby into the slot of the slot member 34. The base plate 33 is further provided with a plurality of slot member guides 37, each having two legs arranged at a predetermined interval parallel with each other for preventing the free end of a slot member 34 from swinging beyond a predetermined distance from its original position during transportation or handling, thereby preventing the circuit board 13 held thereby from contacting other circuit boards 13 or the housing 30.

While the slot members 34 are integrally formed with the base plate 33 in the illustrated embodiment, they may be separate members connected at one end thereof to the base plate 33 through a separate biasing member 36 (which may be made of an elastic material such as plastic or spring steel).

When the chassis 2 used in an electronic equipment housing 30 is temporarily deformed or twisted due to shocks such as vibration and falls during transportation or handling, the rear plate 11 of the chassis 2 and the bracket 5 move away from each other, upon which the second ends 17 of the circuit boards 13 are liable to slide out of the slots of the respective slot members 34 of the second support 32 attached to the bracket 5. However, during this time, the slot members 34 move, due to the elasticity of the bias members 36, to follow the second ends 17 of the circuit boards 13, thereby preventing the second end 17 of the circuit boards 13 from coming out of the slots of the slot members 34. Moreover, the slot members 34 are ensured to return to their original positions when the shocks and vibration cease because of the presence of the slot member guides 37.

Even when the circuit board support housing is sufficiently rigid so that no substantial separation of the first and second supports occurs, the circuit boards 13 sometimes bend due to mechanical shocks or the like during transportation or handling. Even in that event, the circuit boards 13 do not come out of the slots of the slot members 34 of the second support 32 of the present invention, since the slot members 34 are biased by the biasing members 36 to follow the second ends 17 of the circuit boards 13.

According to another embodiment of the present invention shown in FIGS. 7 to 9, the second support comprises an elastic (e.g., plastic) base plate 40 having two members 41 and 42 which extend perpendicularly from both ends thereof. The first extending member 41 is provided at the extremity thereof with a stop 43 for engaging in a fitting hole 44 formed in the bracket 45, which is secured to the bottom plate 10 of the chassis 2. The second extending member 42 is provided at the extremity thereof with a hook 46 for engaging in the bracket 45 through a fitting hole 47. The base plate 40 is provided with a plurality of slot members 48 formed thereon, each being similar to the conventional slot members shown in FIG. 2 and capable of slidably receiving therein a respective board. The base plate 40 is provided with a biasing member 49 having one end attached to the base plate 40 and the other end supported by the bracket 45 at a fitting hole 50. The biasing member 49 disposed between the base plate 40 and the bracket 45 serves to support the base plate 40 at a predetermined position with respect to the bracket 45 and to bias the base plate 40 toward the first support 18. In this embodiment, the biasing member 49 allows the entire second support, including a plurality of slot members 48 formed on the base plate 40, to follow the second ends 17 of the circuit boards 13.

Figure 2:
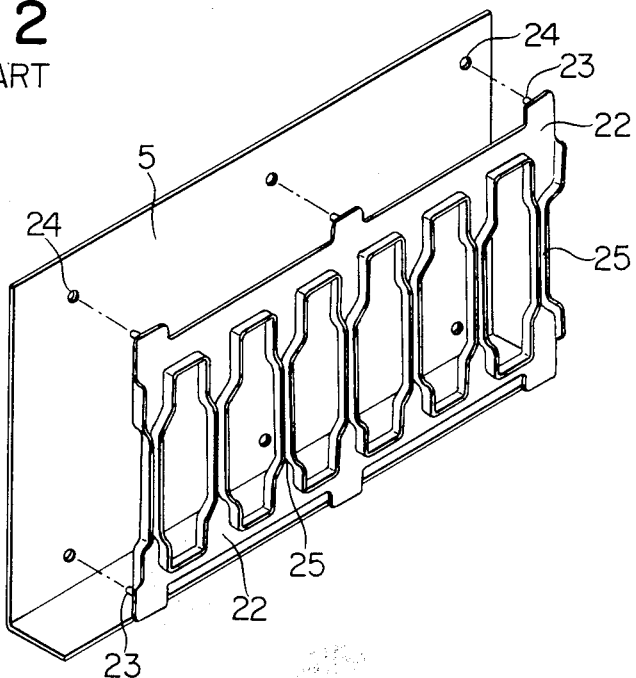
FIG. 2 is a perspective view of a base plate provided thereon with a plurality of slot members for use in the conventional arrangement.
Figure 3:
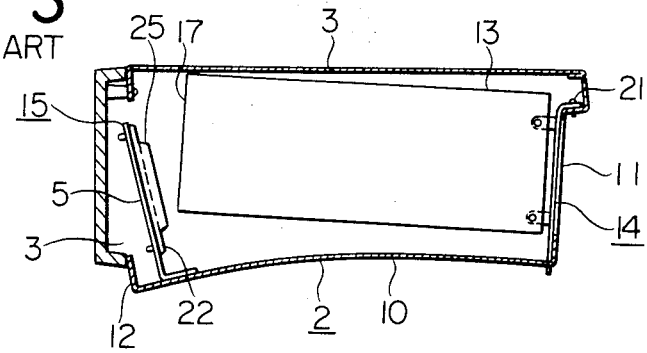
FIG. 3 is a cross sectional view of the housing shown in FIG. 1, when it is deformed.

Referring now to FIG. 10, in which still another embodiment of the present invention is illustrated, the second support of this embodiment has a base plate 50 having thereon elongated slot members 51 similar to the conventional slot members 25 shown in FIG. 2. The base plate 50 is provided at both ends thereof with a first fitting projection 52 and a second fitting projection 53 similar to those shown in FIG. 2. On the other hand, the bracket 54, which is disposed on the bottom plate 10 of the chassis 2, is provided at the upper portion thereof with a first fitting hole 56 in which the first projection 52 is inserted. At the middle portion of the bracket 54, a biasing member 57 made of an elastic material is integrally provided for biasing the base plate 50 toward the first support 18. The biasing member 57 extends downwardly and has at the extremity thereof a second fitting hole 58 in which the second projection 53 is inserted. In this embodiment, the biasing member 57 is an integral member of the bracket 54.

Alternatively, the embodiment shown in FIG. 5 can be combined with the embodiment shown in FIG. 8 or 10. That is, the base plate 33 on which a plurality of slot members 34 are elastically supported can be further additionally elastically mounted to the bracket 45 or 54 by the arrangements shown in FIG. 8 or 10.

As can be seen from the foregoing description, the circuit board support arrangement according to the present invention is provided with a biasing member which is disposed between a bracket and a base plate, or between a base plate and a slot member or both, in such a manner that the biasing member biases the elongated slot members toward a first support. The circuit boards are prevented from sliding out of their slots of the slot members, even when the housing is deformed or twisted or the circuit boards are deformed, due to shocks such as vibration and falls during tranportation or handling.

What is claimed is:

1. An arrangement for supporting at least one circuit board within an electronic equipment housing comprising;

first support means disposed in the housing for rigidly supporting a first end of the circuit board on the housing; and second support means disposed in the housing opposite to said first support means for slidably receiving therein and elastically supporting a second end of the circuit board, wherein said second support means comprises a slot member having a slot for slidably receiving therein said second end of the circuit board and a biasing member disposed beween said slot member and the housing for biasing said slot member toward said first support means, thereby allowing said second support means to follow the second end when the second end of the circuit board moves relative to said housing.

2. An arrangement for supporting a circuit board as claimed in claim 1 wherein said second support means further comprises a base plate attached to the housing, said biasing member being mounted between said base plate and said slot member.

3. An arrangement for supporting a circuit board as claimed in claim 2 wherein said second support means comprises a plurality of said slot members.

4. An arrangement for supporting a circuit board as claimed in claim 3 wherein said second support means is an integrally moulded member made of an elastic plastic material.

5. An arrangement for supporting a circuit board as claimed in claim 1 wherein said second support means further comprises a base plate, said biasing member being mounted between said housing and said base plate.

6. An arrangement for supporting a circuit board as claimed in claim 5 wherein said second support means comprises a plurality of said slot members supported by said base plate.

7. An arrangement for supporting a circuit board as claimed in claim 6 wherein said biasing member is an elongated elastic member having one end attached to said base plate and having the other end thereof in contact with said housing.

8. An arrangement for supporting a circuit board as claimed in claim 6 wherein said biasing member is an elongaged elastic member having one end attached to said housing and having the other end in contact with said base plate.

9. An arrangement for supporting a circuit board as claimed in claim 1 wherein said second support means further comprises a base plate attached to the housing, said biasing member being mounted between said base plate and said slot member and between said housing and said base plate.

* * * * *